United States Patent
Widmann et al.

(10) Patent No.: US 6,864,458 B2
(45) Date of Patent: Mar. 8, 2005

(54) ICED FILM SUBSTRATE CLEANING

(75) Inventors: Amir Widmann, Haifa (IL); David Yogev, Nesher (IL); Yoram Uziel, Post Misgav (IL)

(73) Assignee: Applied Materials, Inc., Santa Clara, CA (US)

( * ) Notice: Subject to any disclaimer, the term of this patent is extended or adjusted under 35 U.S.C. 154(b) by 268 days.

(21) Appl. No.: 10/348,781

(22) Filed: Jan. 21, 2003

(65) Prior Publication Data

US 2004/0140298 A1 Jul. 22, 2004

(51) Int. Cl.$^7$ .................. B23K 26/00; B23K 26/14; B23K 26/16; B23K 26/18
(52) U.S. Cl. ............. 219/121.69; 219/121.84; 219/121.85
(58) Field of Search ............ 219/121.69, 121.85, 219/121.8, 121.82, 121.83, 121.84, 121.6

(56) References Cited

U.S. PATENT DOCUMENTS

| | | | |
|---|---|---|---|
| 4,628,531 A | | 12/1986 | Okamoto et al. |
| 4,980,536 A | * | 12/1990 | Asch et al. ............ 219/121.68 |
| 4,987,286 A | | 1/1991 | Allen |
| 5,023,424 A | | 6/1991 | Vaught |
| 5,024,968 A | | 6/1991 | Engelsberg |
| 5,099,557 A | | 3/1992 | Engelsberg |
| 5,264,912 A | | 11/1993 | Vaught et al. |
| 5,991,044 A | | 11/1999 | Zhang et al. |
| 6,039,059 A | * | 3/2000 | Bran ......................... 134/105 |
| 6,627,846 B1 | * | 9/2003 | Yogev et al. ........... 219/121.85 |
| 2002/0029956 A1 | * | 3/2002 | Allen ...................... 204/157.15 |
| 2003/0091745 A1 | * | 5/2003 | Yogev et al. ............... 427/350 |

FOREIGN PATENT DOCUMENTS

WO    WO 00/38935    7/2000

OTHER PUBLICATIONS

U.S. patent application No.: 09/721,167, filed Nov. 22, 2000, entitled: An In Situ Module For Particle Removal From Solid-state Surfaces.

H.J. Munzer, et al., "Optical Near Field Effects in Surface Nanostructuring and Laser Cleaning", Presented at LPM 2001.

"Welcome to the Web Site for Carbon Dioxide Snow Cleaning", Copyright 1996, Applied Surface Technologies, New Providence, NJ, 2003.

* cited by examiner

Primary Examiner—M. Alexandra Elve
(74) Attorney, Agent, or Firm—Blakely Sokoloff Taylor & Zafman

(57) ABSTRACT

Apparatus for cleaning a surface of a substrate includes a cooling device, which is adapted to cool a region of the substrate in a vicinity of a particle on the surface, so as to cause a fluid in contact with the surface to form a frozen film in the vicinity of the particle. A radiation source is adapted to direct a beam of energy toward the surface so as to cause vaporization of the film due to absorption of the beam in the film, thereby facilitating removal of the particle from the surface.

18 Claims, 1 Drawing Sheet

ICED FILM SUBSTRATE CLEANING

FIELD OF THE INVENTION

The present invention relates generally to processing of semiconductor devices, and specifically to methods and apparatus for removal of foreign particles and contaminants from solid-state surfaces, such as semiconductor wafers and lithography masks.

BACKGROUND OF THE INVENTION

Removal of particles and contaminants from solid state surfaces is a matter of great concern in integrated circuit manufacture. This concern includes, but is not limited to, semiconductor wafers, printed circuit boards, component packaging, and the like. As the trend to miniaturize electronic devices and components continues, and critical dimensions of circuit features become ever smaller, the presence of even a minute foreign particle on a substrate wafer during processing can cause a fatal defect in the circuit. Similar concerns affect other elements used in the manufacturing process, such as masks and reticules.

Various methods are known in the art for stripping and cleaning foreign matter from the surfaces of semiconductor wafers and masks, while avoiding damage to the surface itself. For example, U.S. Pat. No. 4,980,536, whose disclosure is incorporated herein by reference, describes a method and apparatus for removal of particles from solid-state surfaces by laser bombardment. U.S. Pat. Nos. 5,099,557 and 5,024,968, whose disclosures are also incorporated herein by reference, describe methods and apparatus for removing surface contaminants from a substrate by high-energy irradiation. The substrate is irradiated by a laser with sufficient energy to release the particles, while an inert gas flows across the wafer surface to carry away the released particles.

U.S. Pat. No. 4,987,286, whose disclosure is likewise incorporated herein by reference, describes a method and apparatus for removing minute particles (as small as submicron) from a surface to which they are adhered. An energy transfer medium, typically a fluid, is interposed between each particle to be removed and the surface. The medium is irradiated with laser energy and absorbs sufficient energy to cause explosive evaporation, thereby dislodging the particles.

Other local cleaning methods known in the art include localized application of plasma, pressurized gas or vacuum, and carbon dioxide "snow" cleaning.

Snow cleaning systems, such as those produced by Applied Surface Technologies (New Providence, New Jersey), rely on the expansion of either gaseous or liquid carbon dioxide through a nozzle. Applied Surface Technologies' products are described at www.co2clean.com. The carbon dioxide output stream is typically a high velocity solid and gas mix, which is focised at the surface for cleaning. Cleaning is accomplished by a combination of momentum transfer and solvent action of the dry ice on the surface contamination.

SUMMARY OF THE INVENTION

The present invention provides methods and apparatus for efficient removal of particles from solid-state surfaces, and particularly for removal of microscopic particles from a semiconductor substrate (patterned or unpatterned) and from other elements used in semiconductor device production. In the context of the present patent application and in the claims, the word "particle" is used broadly to refer to any contaminant or other foreign substance that must be removed from a surface of the substrate.

In embodiments of the present invention, local cooling is used in combination with a laser beam to clean particles from the surface of a substrate. The area of the substrate in which the particle is located is rapidly cooled, typically by a stream of cold gas or a mixture of cold and frozen gas. A condensable vapor or liquid is applied to the surface in the cooled area, and freezes to form a solid film on the surface around the particle. Then, a pulsed laser beam is applied to the cooled area of the surface. The laser beam energy is absorbed by the film, causing the film to vaporize explosively, thereby cleaning the particle from the surface.

The laser wavelength is typically chosen so that the beam energy is absorbed almost completely by the solid film on the cooled surface. The use of a solid film, rather than liquid films, as in laser cleaning methods known in the art, allows the thickness of the film to be precisely controlled. The laser pulse can thus be adjusted, in conjunction with the film thickness, to deliver a desired dose of explosive energy to the surface, while minimizing possible damage to the substrate itself due to the high-power laser radiation. Such precise control cannot be maintained when liquid films are used, due to typical non-uniformities in the liquid film, which include the formation of liquid droplets. In addition to the problem of non-uniform coverage of the substrate by the liquid, which can cause the substrate to be exposed to direct laser energy, it has been shown that liquid droplets can further exacerbate precise laser radiation control by serving to locally focus high power laser energy on the underlying substrate.

In some embodiments of the present invention, the local cooling and laser irradiation may be used in conjunction with a particle location system, which determines the locations of particles on the surface. In such embodiments, the local cooling, film deposition and laser irradiation may be directed specifically to the locations at which particles (or suspected particles) are detected.

There is therefore provided, in accordance with an embodiment of the present invention, apparatus for cleaning a surface of a substrate, including:

a cooling device, which is adapted to cool a region of the substrate in a vicinity of a particle on the surface, so as to cause a fluid in contact with the surface to form a frozen film in the vicinity of the particle; and a radiation source, which is adapted to direct a beam of energy toward the film so as to cause vaporization of the film due to absorption of at least a portion of the beam in the film, thereby facilitating removal of the particle from the surface.

Typically, the apparatus includes a fluid outlet, which is adapted to dispense the fluid toward the region of the substrate, wherein the fluid comprises a vapor, such as water, which condenses on the surface.

In an embodiment of the invention, the cooling device includes a nozzle, which is adapted to direct a cold flow toward the region of the substrate, and the cold flow includes a mixture of frozen and gaseous carbon dioxide. Alternatively or additionally, the apparatus includes a motion assembly, which is adapted to cause the nozzle and the beam of energy to scan the surface so as to clean at least an area of the surface in the vicinity of the particle. In a further embodiment, the motion assembly is adapted to receive an indication of a position of the particle on the surface, and to cause the nozzle and the beam to clean the surface locally at the position.

Typically, the beam of energy includes a laser beam.

There is also provided, in accordance with an embodiment of the present invention, a method for cleaning a surface of a substrate, including:

cooling a region of the substrate in a vicinity of a particle on the surface so as to cause a fluid in contact with the surface to form a frozen film in the vicinity of the particle; and directing a beam of energy toward the film so as to cause vaporization of the film due to absorption of at least a portion of the beam in the film, thereby facilitating removal of the particle from the surface.

BRIEF DESCRIPTION OF THE DRAWING

The present invention will be more fully understood from the following detailed description of the embodiments thereof, taken together with the drawing in which.

DETAILED DESCRIPTION OF EMBODIMENTS

Figure 1:
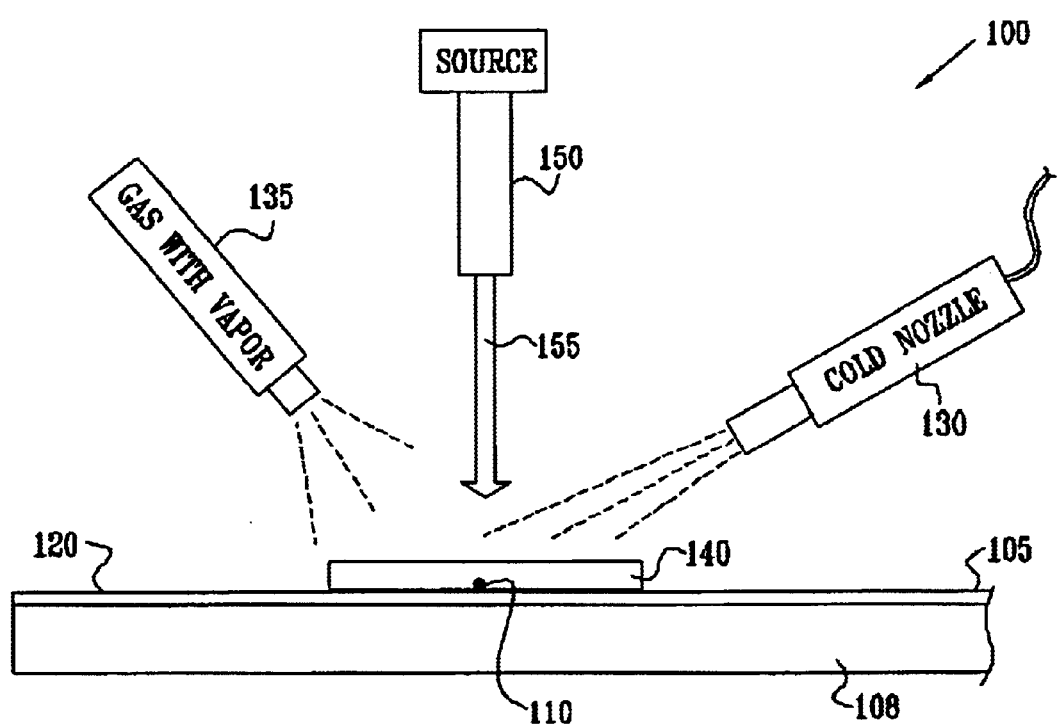
FIG. 1 is a schematic side view of a particle removal system, in accordance with an embodiment of the present invention.

Reference is made to FIG. 1, which is a schematic side view of a particle removal system 100, in accordance with an embodiment of the present invention. A substrate 105 is maintained in position upon a chuck 108 or motion stage. A particle 110 shown in the figure is representative of one or more particles located on a surface 120 of the substrate 105. Typically, substrate 105 is a semiconductor wafer, and surface 120 may be unpatterned, or it may be patterned, with one or more material layers formed on the surface. Alternatively the substrate in this and other embodiments described herein may be a mask, reticle, or substantially any other flat element requiring a very high standard of cleanliness.

Cleaning of particle 110 from surface 120 is accomplished by directing a cold stream mixture, such as a mixture of high-velocity frozen and gaseous $CO_2$, towards the area of particle 110 from a cold nozzle 130. The above-mentioned "snow" nozzles provided by Applied Surface Technologies, for example, may be used for this purpose. Alternatively, other means known in the art, such as a stream of liquid nitrogen or other chilled gas and/or liquid, may be used to cool the area of the particle, or to cool the entire substrate. The cold stream mixture and other parameters are controlled to locally and rapidly cool the area of particle 110 and the surrounding area of surface 120. Preferably, vapor nozzle 135 is maintained from 1–2 mm above surface 120 and the cold stream mixture is applied for up to 0.1 seconds.

Simultaneously with or immediately following cooling of the surface by the cold stream, a controlled stream of gas, saturated with a condensable vapor, is directed towards the area of particle 110, from a vapor nozzle 135. The stream of gas with saturated vapor, typically water, contacts the cooled area adjacent to particle 110, and forms a frozen film 140, typically ice, around particle 110. The timing, direction, composition, temperature and intensity of the cold stream mixture and of the gas/vapor stream are controlled to yield preselected lateral dimensions, thickness, and homogeneity of frozen film 140 upon surface 120. Preferably, frozen film 140 has a diameter of up to 1 mm and a thickness of up to 10 $\mu$m, although films of larger or smaller dimensions may also be used for the purposes of the present invention.

Variations in the height of vapor nozzle 135 above surface 120 directly affect the dimensions of frozen film 140 and the time required for cold stream mixture application. For example, in one set of measurements in which the vapor nozzle was maintained 5 to 7 mm above the surface, and a frozen and gaseous $CO_2$ cold stream mixture was applied for 0.5 seconds, frozen film 140 exhibited a diameter ranging from approximately 5 to 7 mm and a thickness of up to approximately 50 $\mu$m. Holding the vapor nozzle closer to the surface generally yields a smaller, thinner film.

A radiation source 150, typically a pulsed laser, provides an intense beam 155 of energy, which is then fired towards the area of particle 110. The energy is absorbed by frozen film 140, causing the film to explosively vaporize and thereby dislodge or facilitate removal of particle 110. (In the context of the present patent application and in the claims, the term "vaporize" is used to refer to both evaporation and sublimation.) Vaporization of film 140 occurs rapidly, in a time substantially less than 10 milliseconds, and typically less than 1 microsecond. A suction nozzle (not shown) may be provided adjacent to surface 120 in order to remove particle 110 and the other products of the explosive vaporization.

The wavelength of the radiation source may be chosen for optimal interaction with the medium in film 140. For example, if vapor nozzle 135 emits water vapor, so that frozen film 140 comprises ice, a laser operating at or near the water absorption peak of 2.94 $\mu$m may be used. At this wavelength, nearly all the laser radiation is absorbed by a relatively thin film of ice, yielding a strong explosive effect without damage to surface 120. Alternatively, other wavelengths and other types of frozen films may be used, as will be apparent to those skilled in the art. Additionally or alternatively, multiple beams 155, fired together or in succession, may be used to rapidly vaporize frozen film 140. Further details of exemplary surface cleaning processes based on explosive evaporation, which may be applied in system 100, are described in PCT Patent Application PCT/IL99/00701, in U.S. Pat. No. 4,987,286 and in U.S. patent application Ser. No. 09/721,167, which are assigned to the assignee of the present patent application, and whose disclosures are incorporated herein by reference.

System 100 may alternatively be used to clean particles from surface 120 using ambient humidity in the atmosphere above surface 120 to provide vapor, in place of vapor nozzle 135. In other respects, formation of frozen film 140 and subsequent firing of beam 155 is substantially the same as described hereinabove. By whatever means the frozen film is formed, the thickness and other properties of the film should be controlled so that the optical absorption of the film is approximately uniform over the area irradiated by beam 155. Uniformity of the film reduces the likelihood of damage to the underlying surface.

The use of frozen film 140 described hereinabove avoids certain problems found in methods of explosive evaporation using liquid films. Frequently, when a condensable vapor is use to create a liquid film on the surface, individual droplets may form, instead of the formation of a uniform liquid film. As a result, portions of the surface may be exposed to direct irradiation. In order to reduce the risk of damage to the surface, irradiation levels are reduced, with a concomitant reduction in effectiveness of particulate removal. An additional problem, related to droplet formation, is that of a laser energy field intensity enhancement. This problem is described by H. J. Munzer et al., in "Optical Near Field Effects in Surface Nanostructuring and Laser Cleaning", presented at the Laser Precision Microfabrication 2001

Conference (LPM2001, May 18, 2001), whose disclosure is incorporated herein by reference. This paper describes energy field intensity enhancement due to small particles on a surface, which substantially increase laser fluence beneath the particles, causing damage to the surface. The inventors have found that a similar problem of field intensity enhancement can occur due to liquid droplets on the surface to be cleaned.

Empirical measurements made by the inventors using 2.94 $\mu$m wavelength laser radiation directed at a silicon wafer, with and without an ice film, corroborate enhanced attenuation of laser fluence by the ice film. In one set of measurements, direct laser fluence incident on a power meter was measured at 16.5 $\mu$mJ. Maintaining the same laser radiation intensity, with a silicon wafer, without any deposited film, placed between the power meter and the laser, the power meter measured 5.6 mJ laser fluence. Using the same measurement setup with the same laser radiation intensity directed at a silicon wafer with a deposited ice film, 0.24 mJ fluence was measured at the power meter. In contrast, when a water film (composed of water droplets) was deposited on the same wafer, 3.9 mJ fluence was measured at the power meter. Similar, qualitative measurements of laser radiation upon photoresist-coated silicon wafers were performed yielding a laser "spot" on the wafer surface (inferring wafer surface damage) without an ice film and no laser spot with an ice film.

Cold nozzle 130, vapor nozzle 135, and radiation source 150 may be directed to scan particular locations at which particles are known or suspected to exist. Such scanning may be achieved by motion either of the nozzles and the radiation source or of substrate 105 (by moving chuck 108 or an X-Y motion stage on which the substrate is mounted), or by moving the nozzles and the radiation source assembly and substrate 105 in concert. Exemplary methods for carrying out and controlling such motion are described in the above-mentioned U.S. and PCT patent applications.

The location of particle 110 may be determined using an inspection station (not shown in the figure). The inspection station determines the coordinates of particle 110 on surface 120. The coordinates are passed to a processor, which stores the coordinates and transforms them to a coordinate frame of system 100. The coordinates may be converted to polar coordinates, for use in driving the rotation of chuck 108. The coordinates are used to direct the nozzles and the radiation source to remove the particles from the surface. Alternatively, the inspection station may be constructed together with system 100 as a single, integral unit, which both determines the particle coordinates and removes the particles accordingly, without the need to transfer substrate 105 from one entity to the next.

The inspection station may comprise any suitable automated inspection system known in the art, such as those described in U.S. Pat. Nos. 5,264,912, 4,628,531, and 5,023,424, whose disclosures are incorporated herein by reference. For example, the Applied Materials "Compass" or KLA-Tencor "Surfscan" systems may be used for this purpose. Typically, to locate defects on surface 120, such as particle 110, a laser irradiates surface 120, and a detector senses irregularities in the radiation reflected from the surface. Alternatively, other inspection methods, such as optical microscopy or scanning electron microscopy (SEM), may be employed. The irregularities are analyzed to determine the coordinates of particle 110. The use of particle localization systems to determine coordinates of particles to be removed from a surface is described further in the above-mentioned PCT patent application and in U.S. patent application Ser. No. 09/869,058, which is assigned to the assignee of the present patent application, and whose disclosure is incorporated herein by reference.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for cleaning a surface of a substrate, comprising:
    a cooling device, which is adapted to cool a region of the substrate in a vicinity of a particle on the surface, so as to cause a fluid in contact with the surface to form a frozen film in the vicinity of the particle; and
    a radiation source, which is adapted to direct a beam of energy toward the film so as to cause vaporization of the film due to absorption of at least a portion of the beam in the film, thereby facilitating removal of the particle from the surface.

2. Apparatus according to claim 1, and comprising a fluid outlet, which is adapted to dispense the fluid toward the region of the substrate.

3. Apparatus according to claim 2, wherein the fluid comprises a vapor, which condenses on the surface.

4. Apparatus according to claim 3, wherein the vapor comprises water.

5. Apparatus according to claim 1, wherein the cooling device comprises a nozzle, which is adapted to direct a cold flow toward the region of the substrate.

6. Apparatus according to claim 5, wherein the cold flow comprises a mixture of frozen and gaseous carbon dioxide.

7. Apparatus according to claim 5, and comprising a motion assembly, which is adapted to cause the nozzle and the beam of energy to scan the surface so as to clean at least an area of the surface in the vicinity of the particle.

8. Apparatus according to claim 7, wherein the motion assembly is adapted to receive an indication of a position of the particle on the surface, and to cause the nozzle and the beam to clean the surface locally at the position.

9. Apparatus according to claim 1 wherein the beam of energy comprises a laser beam.

10. A method for cleaning a surface of a substrate, comprising:
    cooling a region of the substrate in a vicinity of a particle on the surface so as to cause a fluid in contact with the surface to form a frozen film in the vicinity of the particle; and
    directing a beam of energy toward the film so as to cause vaporization of the film due to absorption of at least a portion of the beam in the film, thereby facilitating removal of the particle from the surface.

11. A method according to claim 10, and comprising dispensing the fluid toward the region of the substrate from a fluid source.

12. A method according to claim 11, wherein dispensing the fluid comprises dispensing a vapor toward the region, so that the vapor condenses on the surface.

13. A method according to claim 2, wherein the vapor comprises water.

14. A method according to claim 10, wherein cooling the region comprises directing a cold flow toward the region.

15. A method according to claim 4, wherein directing the cold flow comprises directing a mixture of frozen and gaseous carbon dioxide toward the region.

16. A method according to claim 14, wherein directing the cold flow and directing the beam of energy comprise scanning the cold flow and the beam of energy over the surface so as to clean at least an area of the surface in the vicinity of the particle.

17. A method according to claim 16, wherein scanning the cold flow and the at least one beam of energy comprises receiving an indication of a position of the particle on the surface, and scanning the cold flow and the beam of energy to clean the surface locally at the position.

18. A method according to claim 10, wherein the beam of energy comprises a laser beam.

* * * * *